（12）United States Patent
Lai et al.

(10) Patent No.: US 9,490,342 B2
(45) Date of Patent: Nov. 8, 2016

(54) METHOD FOR FABRICATING SEMICONDUCTOR DEVICE

(75) Inventors: Chien-Ming Lai, Tainan (TW); Yi-Wen Chen, Tainan (TW); Zhi-Cheng Lee, Tainan (TW); Tong-Jyun Huang, Tainan (TW); Che-Hua Hsu, Hsinchu County (TW); Kun-Hsien Lin, Tainan (TW); Tzung-Ying Lee, Pingtung County (TW); Chi-Mao Hsu, Tainan (TW); Hsin-Fu Huang, Tainan (TW); Chin-Fu Lin, Tainan (TW)

(73) Assignee: UNITED MICROELECTRONICS CORP., HSINCHU (TW)

( * ) Notice: Subject to any disclaimer, the term of this patent is extended or adjusted under 35 U.S.C. 154(b) by 1145 days.

(21) Appl. No.: 13/161,591

(22) Filed: Jun. 16, 2011

(65) Prior Publication Data

US 2012/0322218 A1    Dec. 20, 2012

(51) Int. Cl.
| | |
|---|---|
| *H01L 21/3205* | (2006.01) |
| *H01L 29/66* | (2006.01) |
| *H01L 21/8238* | (2006.01) |
| *H01L 21/28* | (2006.01) |
| *H01L 21/3213* | (2006.01) |
| *H01L 29/423* | (2006.01) |
| *H01L 29/49* | (2006.01) |
| *H01L 29/51* | (2006.01) |
| *H01L 29/78* | (2006.01) |

(52) U.S. Cl.
CPC ..... *H01L 29/6659* (2013.01); *H01L 21/28088* (2013.01); *H01L 21/32134* (2013.01); *H01L 21/823842* (2013.01); *H01L 29/42376* (2013.01); *H01L 29/4966* (2013.01); *H01L 29/66545* (2013.01); *H01L 29/513* (2013.01); *H01L 29/517* (2013.01); *H01L 29/518* (2013.01); *H01L 29/7833* (2013.01)

(58) Field of Classification Search
CPC .............. H01L 21/28079; H01L 21/28088; H01L 21/67075; H01L 21/82345; H01L 21/823842; H01L 21/32134; H01L 21/28–21/88; H01L 29/42376; H01L 29/4966; H01L 29/66545; H01L 29/6659
USPC ........................ 438/585, 303; 257/E21.444
See application file for complete search history.

(56) References Cited

U.S. PATENT DOCUMENTS

| 6,066,533 A | 5/2000 | Yu |
|---|---|---|
| 6,217,611 B1 | 4/2001 | Klostermeyer |
| 6,492,217 B1 | 12/2002 | Bai |

(Continued)

FOREIGN PATENT DOCUMENTS

TW           201301356 A    *  1/2013

OTHER PUBLICATIONS

U.S. Appl. No. "13/070,496", Mar. 24, 2011.

(Continued)

*Primary Examiner* — Trung Q Dang
(74) *Attorney, Agent, or Firm* — WPAT, PC; Justin King

(57) ABSTRACT

A method for fabricating a semiconductor device includes the following steps. Firstly, a dummy gate structure having a dummy gate electrode layer is provided. Then, the dummy gate electrode layer is removed to form an opening in the dummy gate structure, thereby exposing an underlying layer beneath the dummy gate electrode layer. Then, an ammonium hydroxide treatment process is performed to treat the dummy gate structure. Afterwards, a metal material is filled into the opening.

13 Claims, 15 Drawing Sheets

(56) References Cited

U.S. PATENT DOCUMENTS

| | | |
|---|---|---|
| 6,552,377 B1 | 4/2003 | Yu |
| 6,696,345 B2 | 2/2004 | Chau |
| 6,790,719 B1 | 9/2004 | Adetutu |
| 6,794,234 B2 | 9/2004 | Polishchuk |
| 6,902,969 B2 | 6/2005 | Adetutu |
| 6,921,711 B2 | 7/2005 | Cabral, Jr. |
| 7,030,430 B2 | 4/2006 | Doczy |
| 7,074,664 B1 | 7/2006 | White |
| 7,109,079 B2 | 9/2006 | Schaeffer, III |
| 7,126,199 B2 | 10/2006 | Doczy |
| 7,157,378 B2 | 1/2007 | Brask |
| 7,208,366 B2 | 4/2007 | Tsai |
| 7,381,619 B2 | 6/2008 | Wang |
| 7,410,844 B2 * | 8/2008 | Li .................. H01L 21/30608 257/329 |
| 7,488,656 B2 | 2/2009 | Cartier |
| 7,556,998 B2 | 7/2009 | Park |
| 2002/0127888 A1 | 9/2002 | Cho |
| 2004/0145057 A1 * | 7/2004 | Choi ................ H01L 27/10817 257/758 |
| 2005/0095763 A1 | 5/2005 | Samavedam |
| 2005/0269644 A1 * | 12/2005 | Brask et al. .................. 257/369 |
| 2005/0275035 A1 | 12/2005 | Mathew |
| 2005/0277248 A1 * | 12/2005 | Kim .................. H01L 27/11521 438/253 |
| 2006/0040482 A1 | 2/2006 | Yang |
| 2006/0046523 A1 * | 3/2006 | Kavalieros et al. .......... 438/791 |
| 2006/0175297 A1 * | 8/2006 | Yun ........................ C11D 1/146 216/88 |
| 2007/0037335 A1 | 2/2007 | Chambers |
| 2007/0082445 A1 | 4/2007 | Yang |
| 2007/0148838 A1 | 6/2007 | Doris |
| 2007/0167024 A1 * | 7/2007 | Li ...................... H01L 21/30608 438/753 |
| 2007/0210354 A1 | 9/2007 | Nabatame |
| 2008/0076216 A1 | 3/2008 | Pae |
| 2008/0318371 A1 | 12/2008 | Lin |
| 2009/0057787 A1 | 3/2009 | Matsuki |
| 2009/0166769 A1 | 7/2009 | Metz |
| 2010/0052074 A1 | 3/2010 | Lin |
| 2010/0068877 A1 | 3/2010 | Yeh |
| 2010/0081262 A1 | 4/2010 | Lim |
| 2010/0087038 A1 * | 4/2010 | Chung et al. ................. 438/199 |
| 2010/0240204 A1 | 9/2010 | Yeh et al. |
| 2011/0230042 A1 * | 9/2011 | Chew et al. ................. 438/585 |
| 2012/0248550 A1 * | 10/2012 | Huang .................. H01L 27/088 257/410 |

OTHER PUBLICATIONS

Taiwan Intellectual Property Office, Office Action issued Aug. 8, 2016.

* cited by examiner

METHOD FOR FABRICATING SEMICONDUCTOR DEVICE

FIELD OF THE INVENTION

The present invention relates to a method for fabricating a semiconductor device, and more particularly to a method for fabricating a field effect transistor (FET) with a metal gate structure.

BACKGROUND OF THE INVENTION

As the demand on the device integration of an integrated circuit is gradually increased, the feature size of a semiconductor device (e.g. a field effect transistor) becomes smaller and smaller, and the thickness of a gate oxide layer of the field effect transistor is reduced. For maintaining the dielectric performance and reducing current leakage, the gate oxide layer of the semiconductor device is usually made of a high-k material. Moreover, since the doping capacity of the conventional polysilicon gate electrode is limited, the efficacy of using the doped polysilicon gate electrode to improve the threshold voltage is usually insufficient. Nowadays, for solving the problems resulting from reduction of the device feature size, the polysilicon gate electrode is gradually replaced by a metal gate electrode.

However, it is still a challenge for those skilled in the art to increase the working performance and the production yield of the field effect transistor.

Therefore, there is a need of providing an advanced method for fabricating a field effect transistor in order to improve the working performance of the field effect transistor and increase the production yield thereof.

SUMMARY OF THE INVENTION

Therefore, the object of the present invention is to provide a method for fabricating a semiconductor device in order to improve the working performance of a field effect transistor and increase the production yield thereof.

In accordance with an aspect, the present invention provides a method for fabricating a semiconductor device. Firstly, a dummy gate structure having a dummy gate electrode layer is provided. Then, the dummy gate electrode layer is removed to form an opening in the dummy gate structure, thereby exposing an underlying layer beneath the dummy gate electrode layer. Then, an ammonium hydroxide (NH$_4$OH) treatment process is performed to treat the dummy gate structure. Afterwards, a metal material is filled into the opening.

In an embodiment, the underlying layer is a gate oxide layer or a barrier layer. Preferably, the barrier layer is a tantalum nitride layer or a silicon nitride layer.

In an embodiment, the dummy gate structure includes a gate oxide layer, a barrier layer, the dummy gate electrode layer and a spacer. The gate oxide layer is formed on a substrate. The barrier layer is formed on the gate oxide layer. The dummy gate electrode layer is formed on the barrier layer. The spacer is formed over the substrate to surround the gate oxide layer, the barrier layer and the dummy gate electrode layer. Moreover, the step of removing the dummy gate electrode layer further comprises a step of pulling back the spacer.

In an embodiment, the gate oxide layer is made of a high dielectric constant material, wherein after the gate oxide layer is formed, an ion-implanting process is performed to form source/drain regions in the substrate and adjacent to the dummy gate structure.

In an embodiment, the method for fabricating the semiconductor device further includes the following steps. Before the step of removing the dummy gate electrode layer is performed, an ion-implanting process is performed to form source/drain regions in the substrate and adjacent to the dummy gate structure. After the ammonium hydroxide treatment process is performed, a high-k dielectric layer is formed within the opening.

In an embodiment, the ammonium hydroxide treatment process is performed in an ammonium hydroxide solution at an operating temperature of 60° C., wherein the ammonium hydroxide solution is a mixture of ammonium hydroxide and water in a ratio of 1:120.

In an embodiment, the step of removing the dummy gate electrode layer and the ammonium hydroxide treatment process are performed in the same process vessel.

In accordance with another aspect, the present invention provides a method for fabricating a semiconductor device. Firstly, a dummy gate structure having a dummy gate electrode layer is provided. Then, a pre-etching process is performed to remove a portion of the dummy gate electrode layer. Then, an ammonium hydroxide treatment process is performed to remove the remaining dummy gate electrode layer, thereby forming an opening in the dummy gate structure and exposing an underlying layer beneath the dummy gate electrode layer. Afterwards, a metal material is filled into the opening.

In an embodiment, the pre-etching process is a wet etching process carried out in a tetramethylammonium hydroxide (TMAH) solution.

In an embodiment, at least one-third of the dummy gate electrode layer is removed by the pre-etching process, and at least one half of the dummy gate electrode layer is removed by the ammonium hydroxide treatment process.

In an embodiment, the underlying layer is a gate oxide layer or a barrier layer. Preferably, the barrier layer is a tantalum nitride layer or a silicon nitride layer.

In an embodiment, the dummy gate structure includes a gate oxide layer, a barrier layer, the dummy gate electrode layer and a spacer. The gate oxide layer is formed on a substrate. The barrier layer is formed on the gate oxide layer. The dummy gate electrode layer is formed on the barrier layer. The spacer is formed over the substrate to surround the gate oxide layer, the barrier layer and the dummy gate electrode layer. Moreover, after the pre-etching process and before the ammonium hydroxide treatment process, the method for fabricating a semiconductor device further includes a step of pulling back the spacer.

In an embodiment, the gate oxide layer is made of a high dielectric constant material, wherein after the gate oxide layer is formed, an ion-implanting process is performed to form source/drain regions in the substrate and adjacent to the dummy gate structure.

In an embodiment, the method for fabricating the semiconductor device further includes the following steps. Before the step of removing the dummy gate electrode layer is performed, an ion-implanting process is performed to form source/drain regions in the substrate and adjacent to the dummy gate structure. After the ammonium hydroxide treatment process is performed, a high-k dielectric layer is formed within the opening.

In an embodiment, the ammonium hydroxide treatment process is performed in an ammonium hydroxide solution at an operating temperature of 60° C., wherein the ammonium hydroxide solution is a mixture of ammonium hydroxide and water in a ratio of 1:120.

In an embodiment, the step of removing the dummy gate electrode layer and the ammonium hydroxide treatment process are performed in the same process vessel.

The present invention provides an improved method for fabricating a semiconductor device. In the later stage of removing the dummy gate electrode layer, an ammonium hydroxide treatment process is performed to minimize the residual dummy gate electrode layer, so that the working function layer between the gate oxide layer and the metal gate electrode formed in the subsequent process has a satisfactory working function value to meet the electrical requirements of the metal gate electrode. In such way, the working performance of the transistor is enhanced and the production yield of the transistor is increased.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides an improved method for fabricating a field effect transistor (FET) with enhanced working performance and production yield. The above and other objects, features and advantages of the present invention will become more readily apparent to those ordinarily skilled in the art after reviewing the following detailed description and accompanying drawings. An example of the present invention will be illustrated by referring to a method for fabricating a complementary metal-oxide-semiconductor (CMOS) device. Nevertheless, the present invention is not limited to a method for fabricating the CMOS device.

FIGS. 1A~1K are schematic cross-sectional views illustrating a method for fabricating a CMOS device 100 according to an embodiment of the present invention.

Figure 1A:
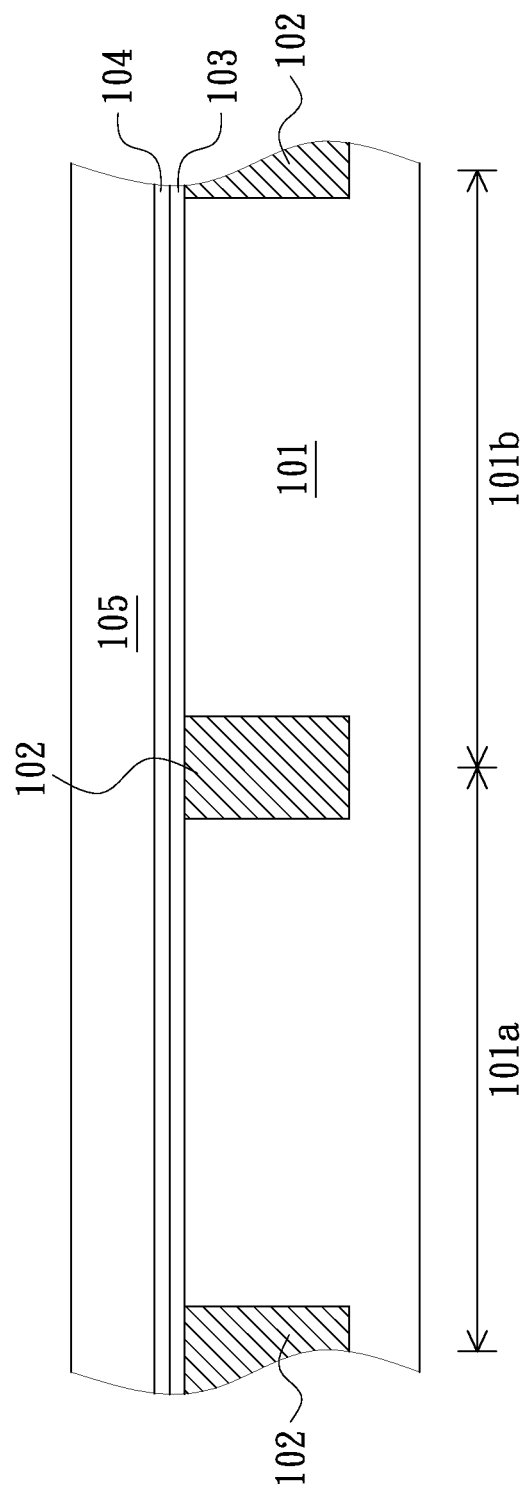
FIGS. 1A~1K are schematic cross-sectional views illustrating a method for fabricating a CMOS device according to an embodiment of the present invention.
Figure 1B:
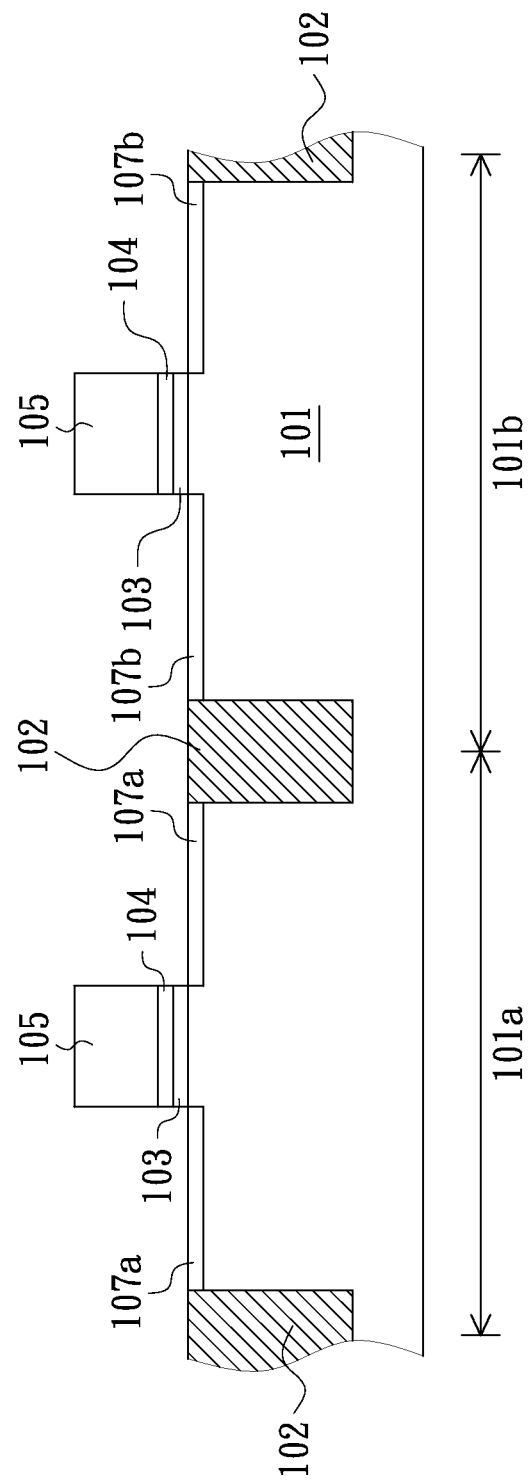

Firstly, as shown in FIG. 1A, a gate oxide layer 103, a barrier layer 104 and a dummy gate electrode layer 105 are sequentially formed over a P-type active region 101a and an N-type active region 101b of a substrate 101. The P-type active region 101a and the N-type active region 101b are separated from each other by a shallow trench isolation structure 102. In addition, the barrier layer 104 is disposed on the gate oxide layer 103, and the dummy gate electrode layer 105 is disposed on the barrier layer 104.

The dummy gate electrode layer 105 is preferably made of polysilicon. The gate oxide layer 103 may be made of a low dielectric constant material such as silicon dioxide, silicon nitride, silicon oxynitride or silicon carbon nitride. Alternatively, the gate oxide layer 103 may be made of a high dielectric constant material such as hafnium silicon, hafnium oxide, hafnium silicon oxide, hafnium silicon oxynitride, hafnium silicon nitride, hafnium aluminum oxide, aluminum oxide, titanium oxide, strontium titanium oxide, tantalum oxide, zirconium oxide, zirconium silicon oxide, lead lanthanum zirconate titanate, barium strontium titanate or a combination thereof. In this embodiment, the gate oxide layer 103 consists of a high-k dielectric layer and a interfacial layer, wherein the interfacial layer made of silicon oxide or silicon nitride plus silicon oxide and the high-k dielectric layer is made of hafnium silicon, hafnium oxide, hafnium silicon oxide, hafnium silicon oxynitride, hafnium silicon nitride, hafnium aluminum oxide, aluminum oxide, titanium oxide, strontium titanium oxide, tantalum oxide, zirconium oxide, zirconium silicon oxide, lead lanthanum zirconate titanate, barium strontium titanate or a combination thereof.

The barrier layer 104 is made of tantalum nitride (TaN), silicon nitride (SiN), titanium nitride (TiN) or tungsten nitride (WN). In some embodiments, the barrier layer 104 is a multi-layered structure stacked by a silicon nitride layer and a tantalum nitride layer. In this embodiment, the barrier layer 104 is a tantalum nitride layer.

Then, after the gate oxide layer 103, the barrier layer 104 and the dummy gate electrode layer 105 are patterned, a series of lightly doping processes are performed to dope the P-type active region 101a and the N-type active region 101b of the substrate 101 with ion dopants such as a phosphorous ion ($P^{3-}$) dopant and a boron ion ($B^+$) dopant. After the lightly doping processes are performed, lightly doped drain (LDD) regions 107a and 107b are respectively formed in the P-type active region 101a and the N-type active region 101b and adjacent to the patterned gate oxide layer 103, the pattered barrier layer 104 and the patterned dummy gate electrode layer 105 (see FIG. 1B). Typically, at least one sub-spacer (not shown) may be formed on the patterned gate oxide layer 103, the barrier layer 104 and the dummy gate electrode layer 105, prior to the lightly doping processes.

Figure 1C:
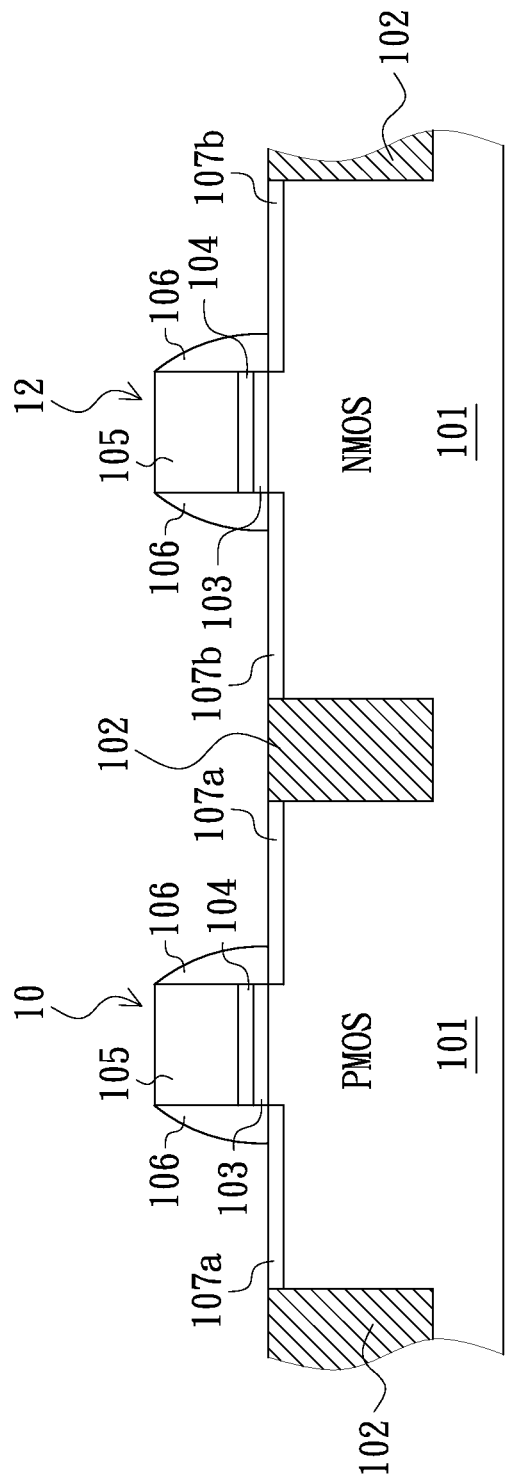
Figure 1D:
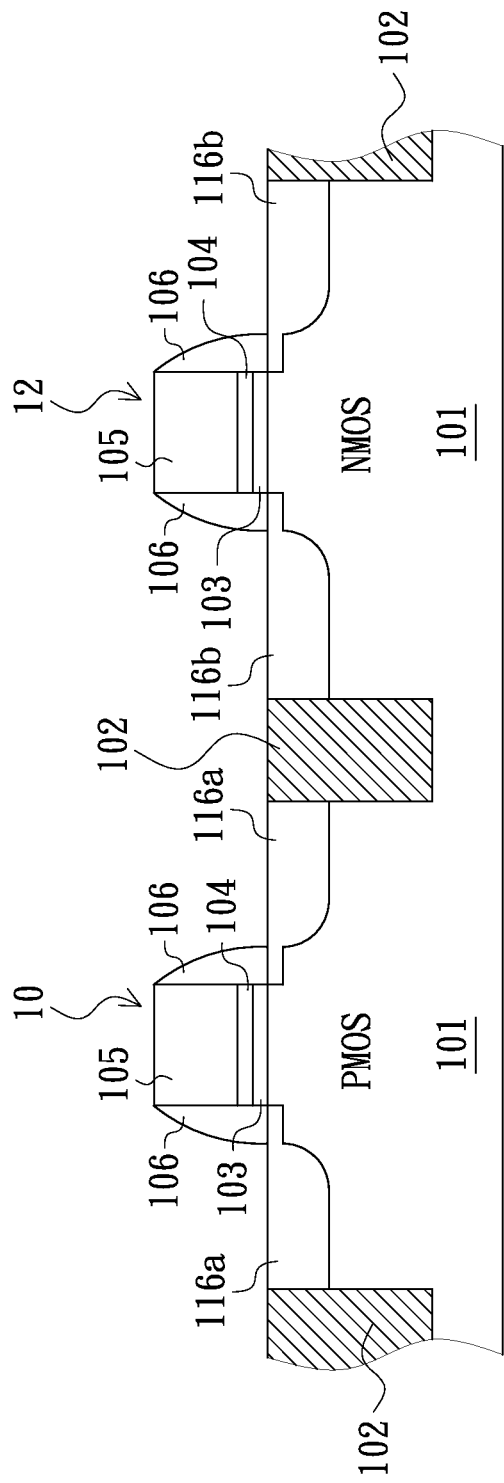
Figure 1E:
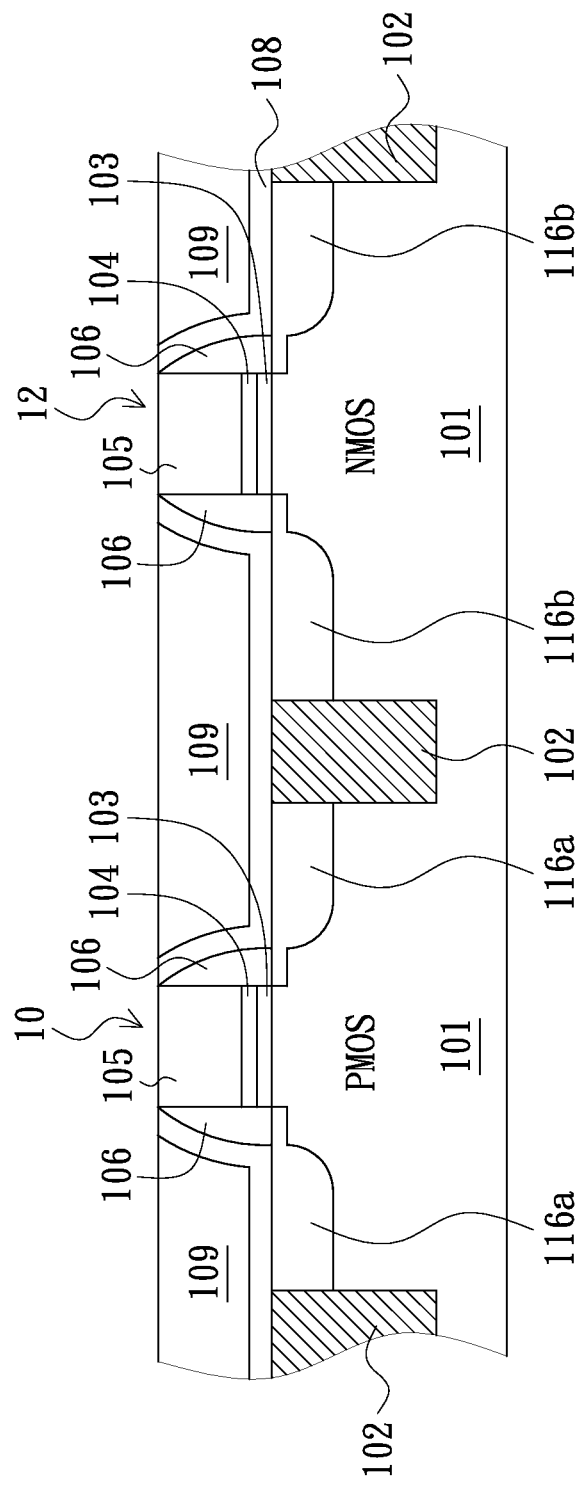
Figure 1F:
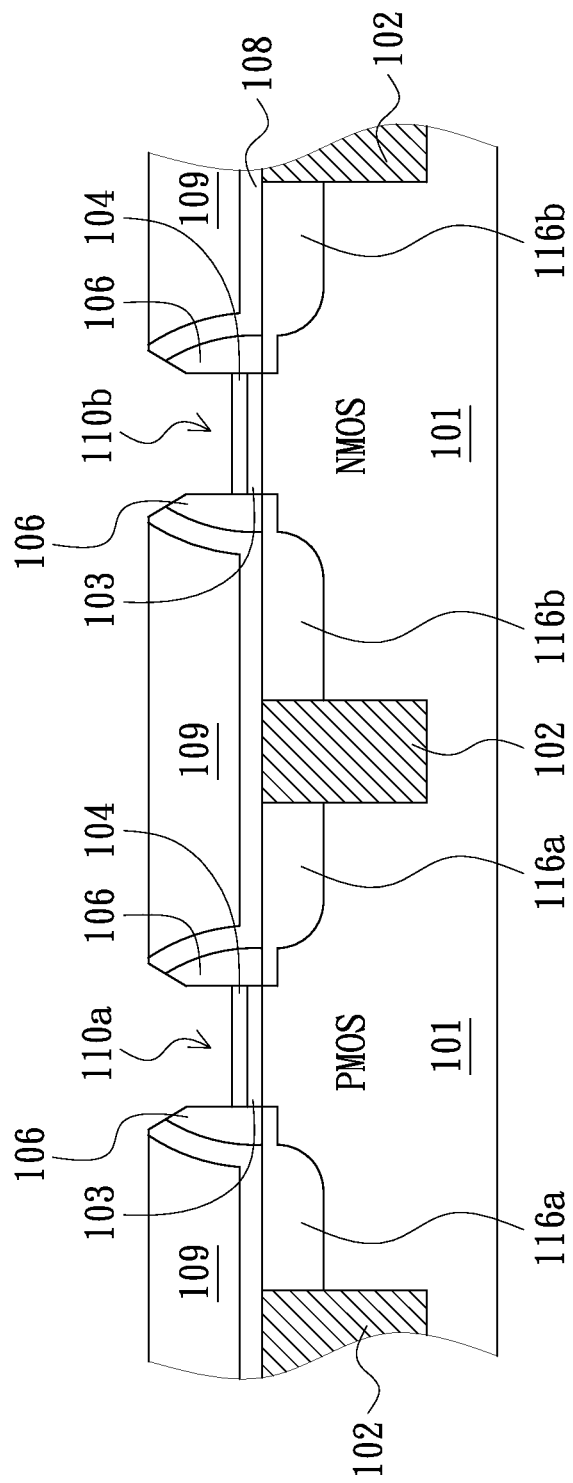

Then, a spacer 106 is formed over the substrate 101 to surround the gate oxide layer 103, the barrier layer 104 and the dummy gate electrode layer 105. The spacer 106 is produced by the following steps. Firstly, a dielectric layer (not shown) is formed on the substrate 101 to cover the gate oxide layer 103, the barrier layer 104 and the dummy gate electrode layer 105. Then, an etching process is performed to remove a portion of the dielectric layer and allow the remaining dielectric layer to surround the sidewalls of the gate oxide layer 103, the barrier layer 104 and the dummy gate electrode layer 105. In such way, as shown in FIG. 1C, the dummy gate structures 10 and 12 are formed over the P-type active region 101a and the N-type active region 101b, respectively.

Then, by using the spacer 106 as a mask, an ion-implanting process is performed to heavily dope the substrate 101 with a high concentration ion dopant. As a result, the LDD regions 107a and 107b which are not heavily doped and the heavily doped regions are collectively formed as source/drain regions 116a and 116b (see FIG. 1D). Besides, prior to forming the source/drain regions 116a and 116b, series of etching process and epitaxial growth process may be carried out in order to form a raised structure (shown) on the substrate 101 adjacent to the dummy gate structures 10 and 12, the location where is predetermined to form the source/drain regions 116a.

Then, a contact etch stop layer (CESL) 108 and an interlayer dielectric layer (ILD) 109 are sequentially formed on the substrate 101 and the dummy gate structures 10 and 12. Then, by using the contact etch stop layer 108 as a mask, a series of chemical mechanical polishing (CMP) processes or etching processes are performed to partially remove the contact etch stop layer 108 and the interlayer dielectric layer 109, thereby exposing the dummy gate electrode layer 105 (see FIG. 1E).

Then, a dummy gate electrode layer etching process is performed to remove the dummy gate electrode layer 105, so that two openings 110a and 110b are respectively formed in the dummy gate structures 10 and 12 to expose the barrier layer 104 beneath the dummy gate electrode layer 105. It is noted that the dummy gate electrode layer etching process may also remove the barrier layer 104 directly so as to expose the gate oxide layer 103.

In an embodiment, the dummy gate electrode layer etching process is a single dry etching process. For example, the dry etching process is carried out by using carbon tetrafluoride ($CF_4$)/nitrogen gas ($N_2$) or chlorine ($Cl_2$) as a reactive gas. In another embodiment, the dummy gate electrode layer etching process is a single wet etching process. For example, the wet etching process is carried out by using an ammonium hydroxide solution, a phosphoric acid solution, a tetramethylammonium hydroxide (TMAH) solution or a combination thereof as an etchant. In some embodiments, the dummy gate electrode layer etching process may comprise a plurality of dry etching processes or a plurality of wet etching processes. In this embodiment, the dummy gate electrode layer etching process is a wet etching process carried out by using the tetramethylammonium hydroxide solution as an etchant. Moreover, during the step of removing the dummy gate electrode layer 105, a pull-back process may be performed on the spacer 106 to widen the openings 110a and 110b (see FIG. 1F). The pull-back process is advantageous for performing the subsequent process of filling a metal material.

Figure 1G:
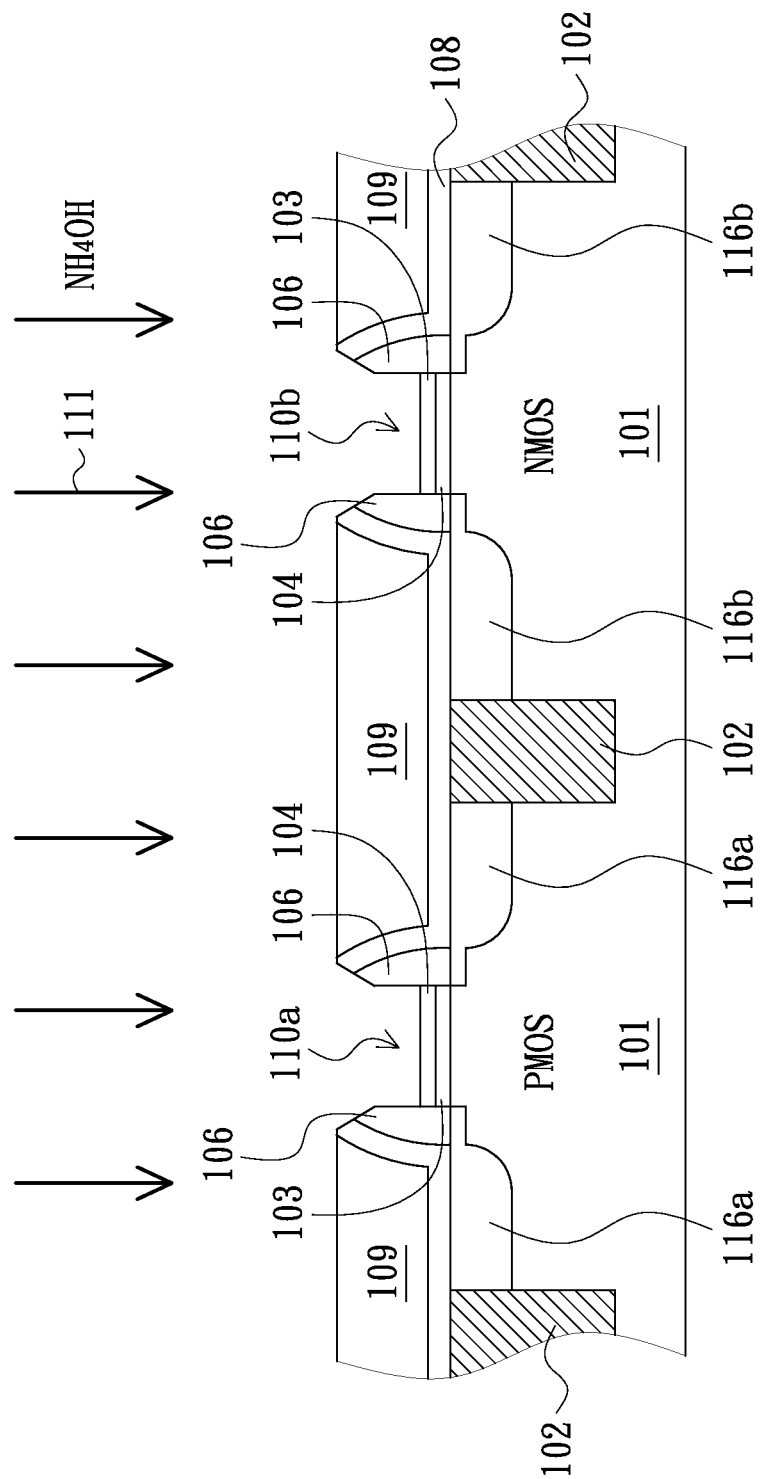

After the dummy gate electrode layers 105 are removed, the dummy gate structures 10 and 12 without the dummy gate electrode layer 105 are subject to an ammonium hydroxide treatment process 111 (see FIG. 1G). In an embodiment, the ammonium hydroxide treatment process 111 is performed to treat the dummy gate structures 10 and 12 with an ammonium hydroxide solution at an operating temperature of 60° C., wherein the ammonium hydroxide solution is a mixture of ammonium hydroxide ($NH_4OH$) and water ($H_2O$) in a ratio of 1:120. Moreover, in this embodiment, the step of removing the dummy gate electrode layers 105 and the ammonium hydroxide treatment process 111 are performed in the same process vessel.

Figure 1H:
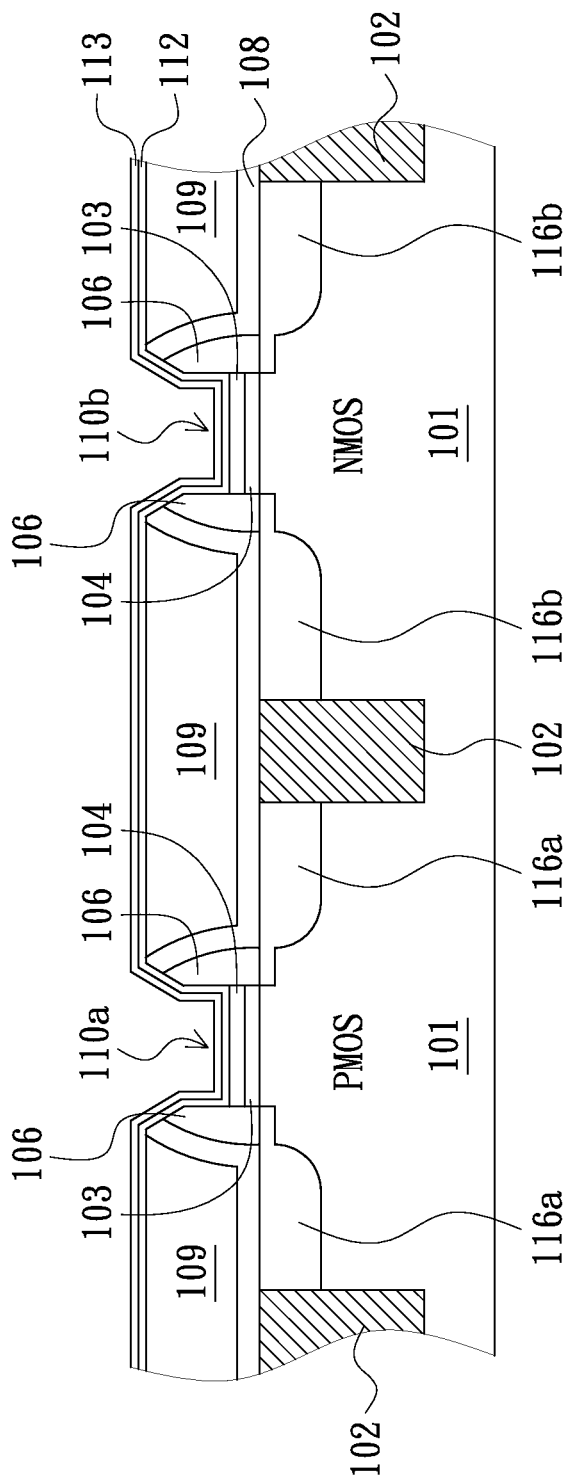
Figure 1I:
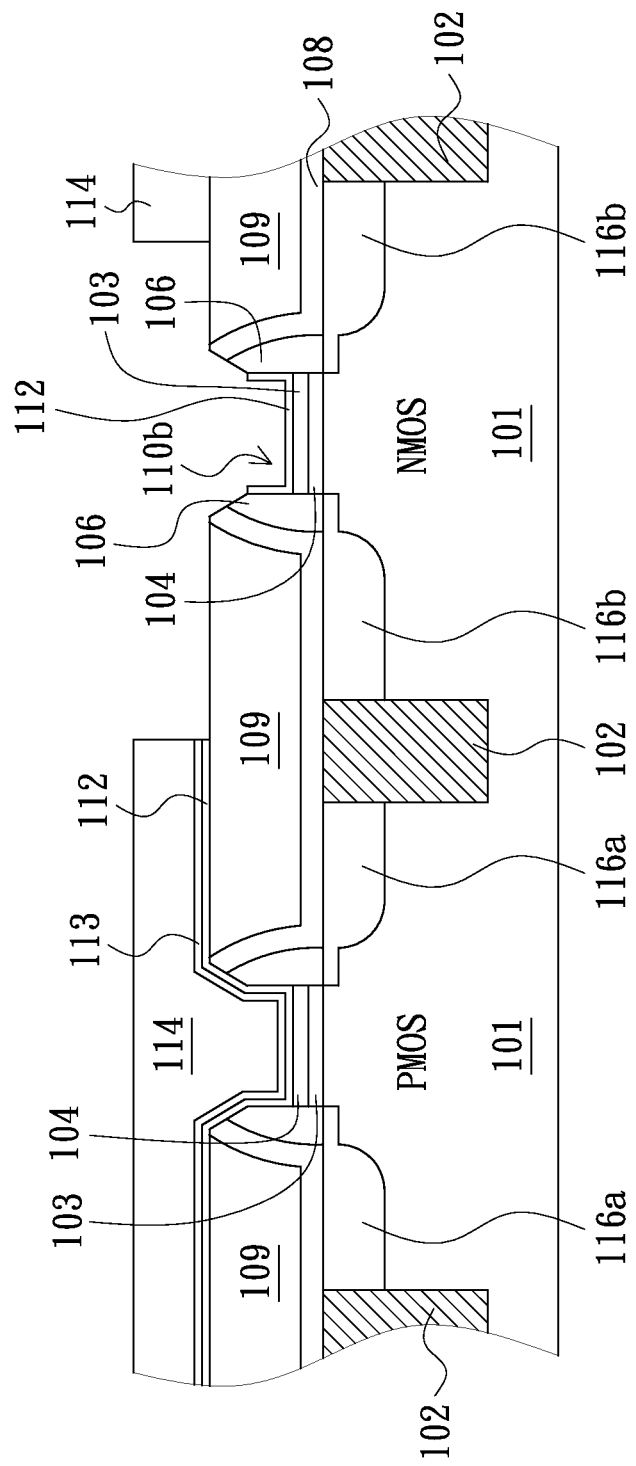
Figure 1J:
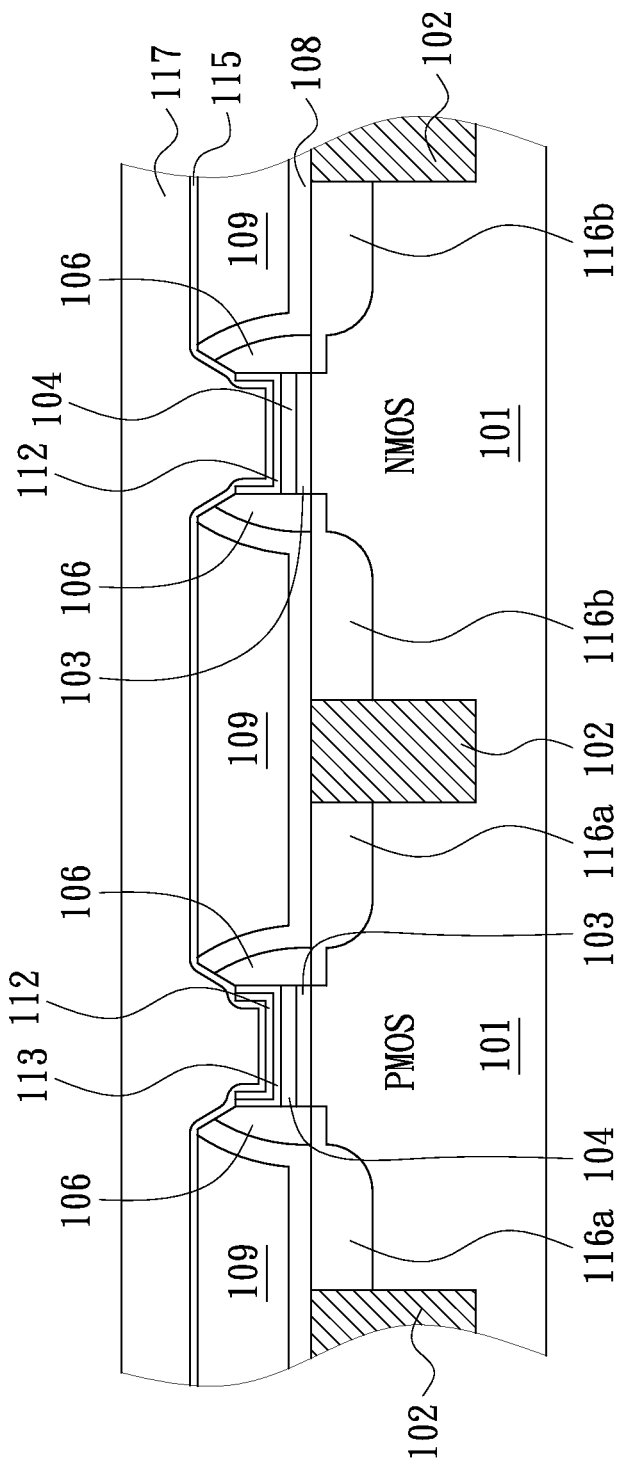
Figure 1K:
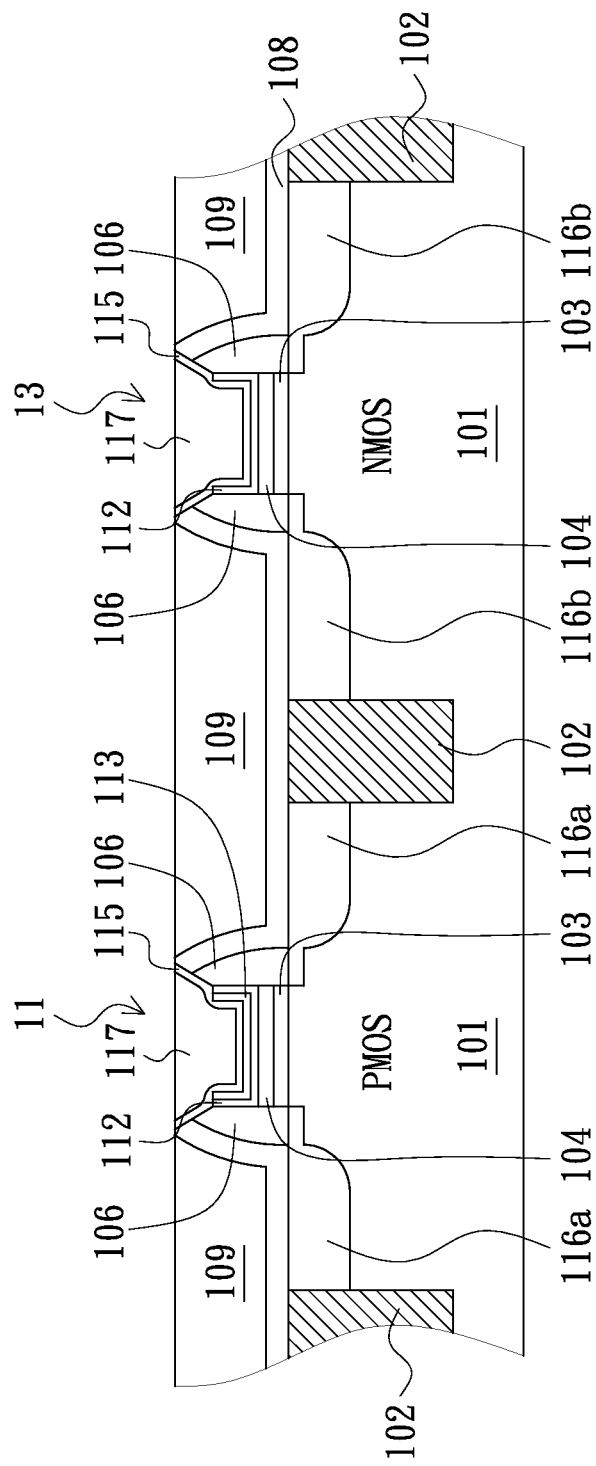

Then, as shown in FIG. 1H, a tantalum nitride (TaN) layer 112 and a silicon nitride (SiN) layer 113 are sequentially deposited on the barrier 104 and the sidewalls of the openings 110a and 110b. Then, as shown in FIG. 1I, a patterned photoresist layer 114 is formed over the tantalum nitride layer 112 and the silicon nitride layer 113 and filled in the opening 110a at the P-type active region 101a, but the opening 110b at the N-type active region 101b is exposed. Then, by using the tantalum nitride layer 112 as an etch stop layer, an etching process is performed to remove the silicon nitride layer 113 that is formed within the opening 110b at the N-type active region 101b.

After the patterned photoresist layer 114 is removed, the silicon nitride layer 113 within the opening 110a and the tantalum nitride layer 112 within the opening 110b are covered by a titanium-aluminum (TiAl) compound layer 115. Then, a metal material 117 such as aluminum (Al) is filled in the openings 110a and 110b (see FIG. 1J). After a planarization process is performed, the transistors 11 and 13 with metal gate electrodes are produced (see FIG. 1K).

As known, in the conventional process of removing the dummy gate electrode layers 105, residual polysilicon possibly remains on the bottom surfaces and sidewalls of the openings 110a and 110b. Due to the residual polysilicon, the electrical properties of the working function layers and the metal gate electrodes filled within the openings 110a and 110b in the subsequent processes may be deviated, and thus the performance of the transistors will be deteriorated. Since the ammonium hydroxide treatment process 111 of the present invention is effective to eliminate the residual polysilicon possibly remaining on the bottom surfaces and sidewalls of the openings 110a and 110b, the working function layers (e.g. the silicon nitride layer 113, the tantalum nitride layer 112 or the titanium-aluminum compound layer 115) and the metal gate electrodes formed on the sidewalls of the openings 110a and 110b in the subsequent processes will have satisfactory working function values to meet the electrical requirements of the transistors.

It is noted that the gate oxide layer 103 described in the above embodiment (FIGS. 1A~1K) is made of a high dielectric constant material. Moreover, since the step of forming the high-k dielectric layer (i.e. the gate oxide layer 103) is prior to the step of forming the source/drain regions 116a and 116b and an annealing process, the fabricating method of the above embodiment may be referred as a high-k first process.

Figure 2:
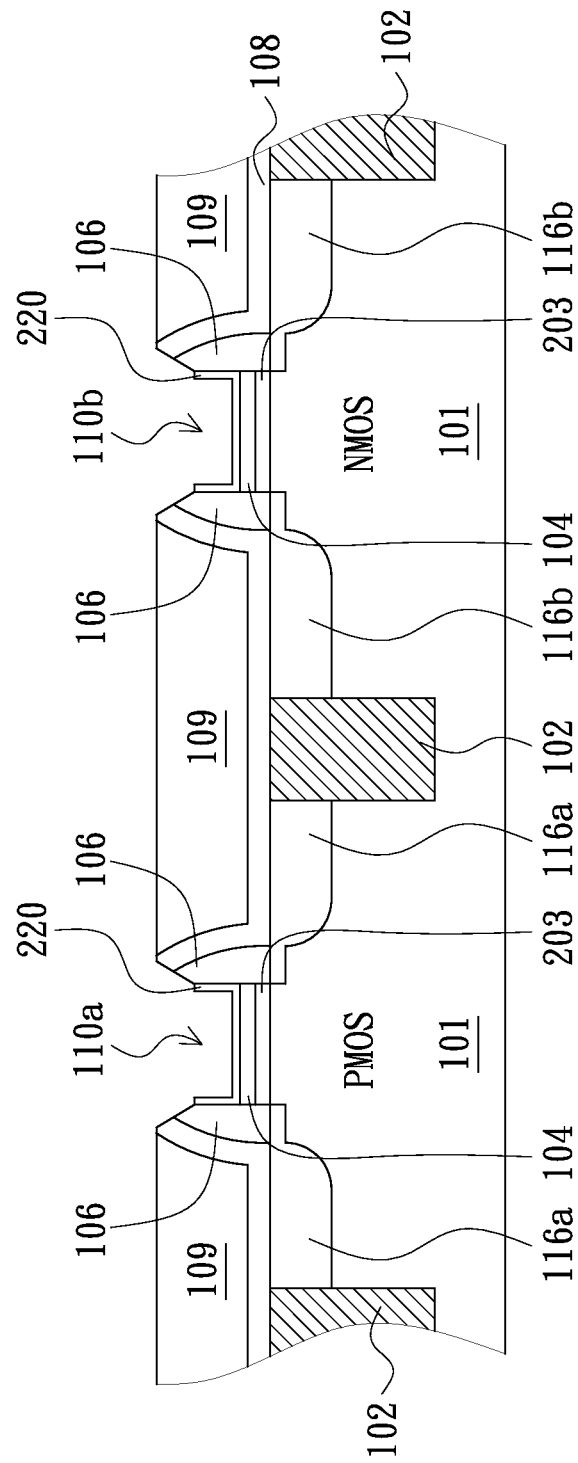
FIG. 2 is a schematic cross-sectional view illustrating a step of a method for fabricating a CMOS device according to another embodiment of the present invention.

In another embodiment of a method for fabricating a CMOS device, the gate oxide layer 203 of the dummy gate structures 10 and 12 is made of a low dielectric constant material. After the ammonium hydroxide treatment process 111 is performed (see FIG. 1G), a high-k dielectric layer 220 is formed on the gate oxide layer 203 (see FIG. 2). Since the step of forming the high-k dielectric layer 220 is posterior to the step of forming the source/drain regions 116a and 116b and the annealing process, the fabricating method of this embodiment may be referred as a high-k last process. The subsequent processes after the step of forming the high-k dielectric layer are similar to those shown in FIGS. 1H~1K, and are not redundantly described herein.

Figure 3A:
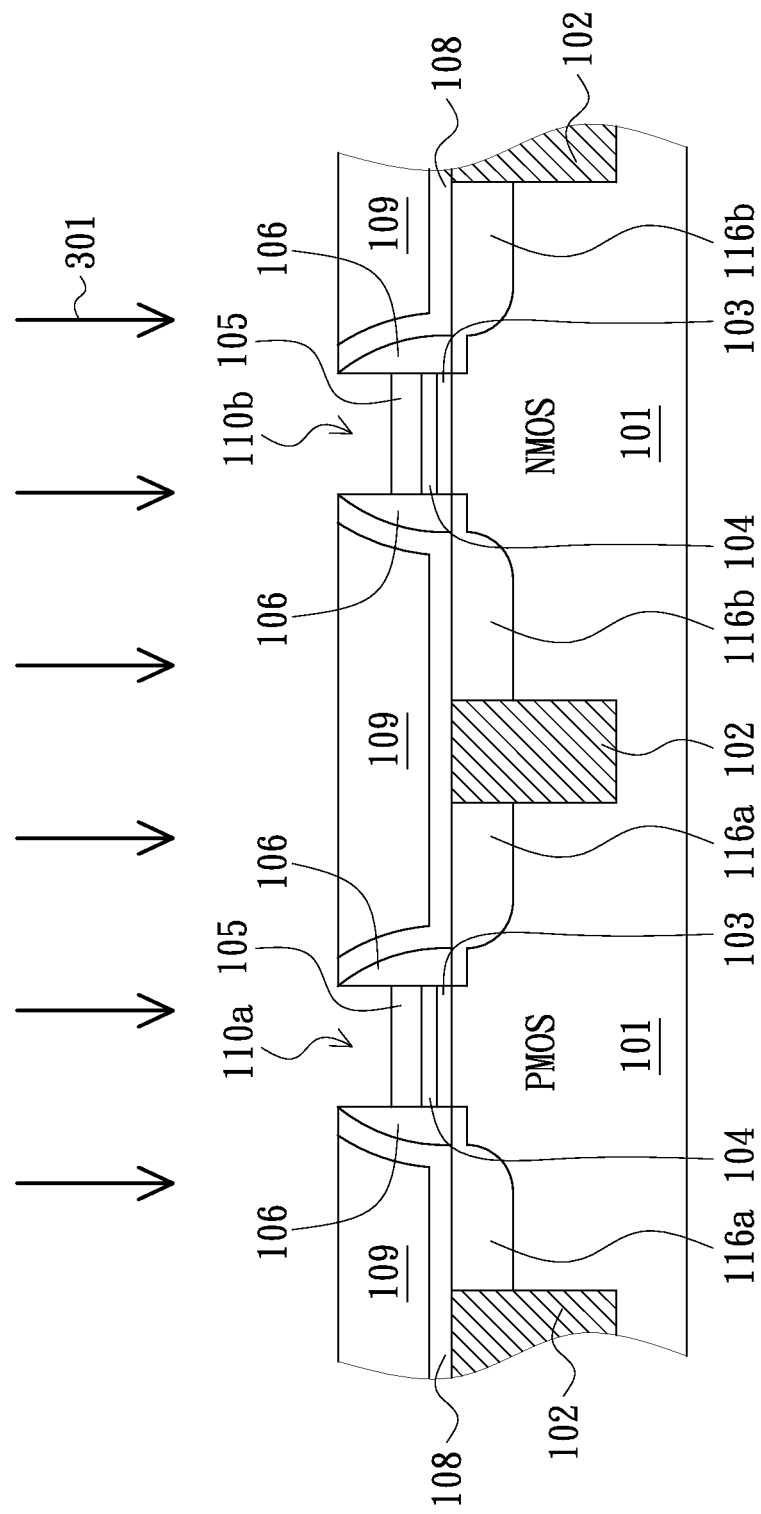
FIGS. 3A~3C are schematic cross-sectional views illustrating some steps of a method for fabricating a CMOS device according to a further embodiment of the present invention.
Figure 3B:
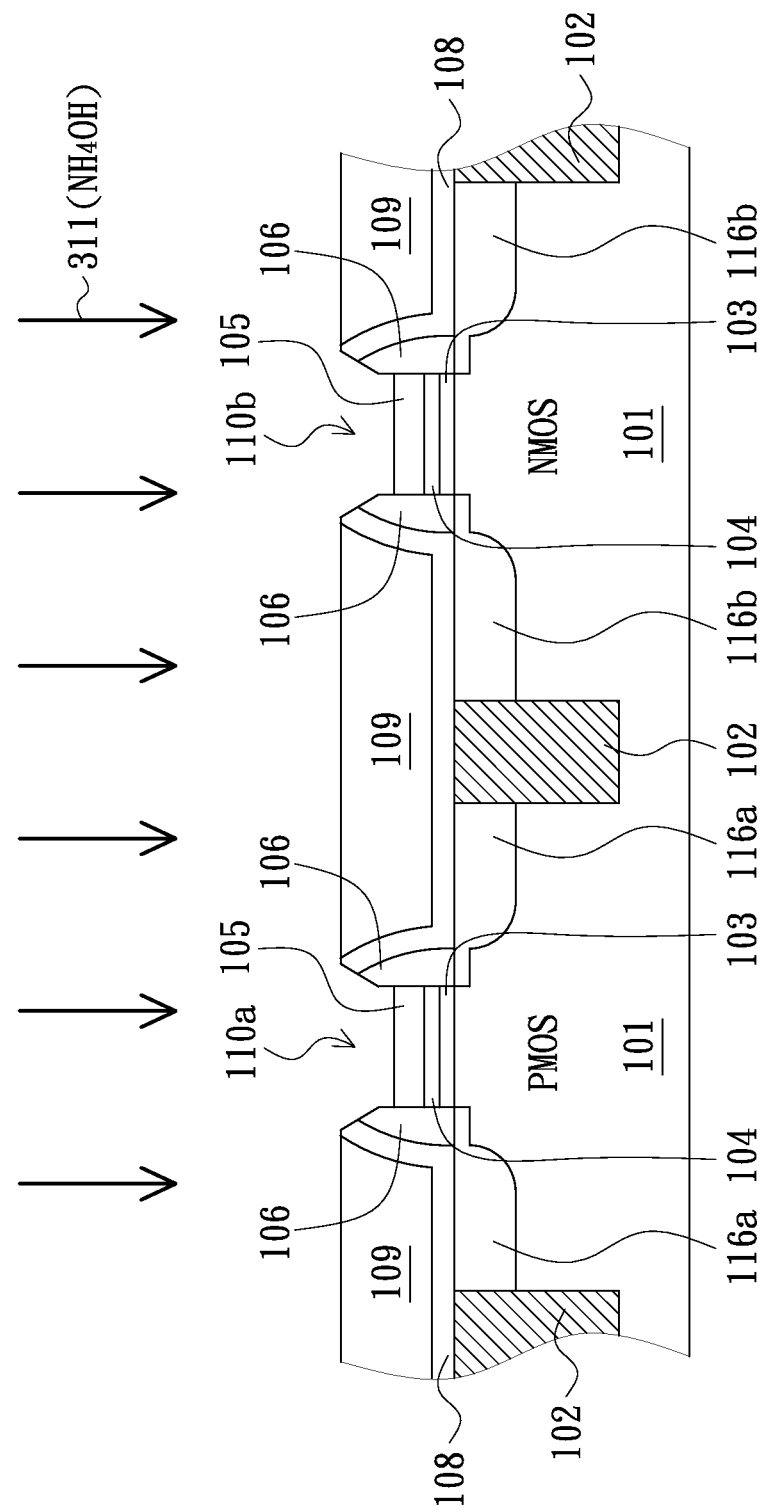
Figure 3C:
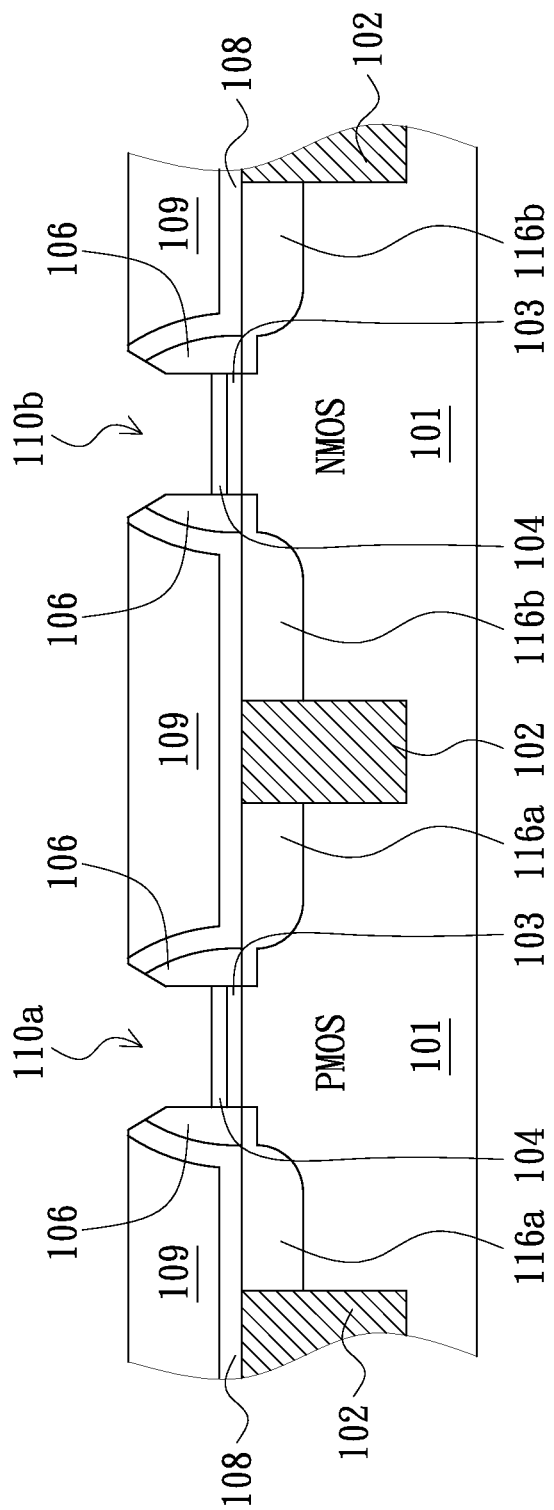

Please refer to FIGS. 3A~3C. FIGS. 3A~3C are schematic cross-sectional views illustrating some steps of a method for fabricating a CMOS device 100 according to a further embodiment of the present invention.

In comparison with the fabricating method described in FIGS. 1A~1K, the fabricating method of this embodiment is distinguished in the dummy gate electrode layer etching process. Hereinafter, only the dummy gate electrode layer etching process will be illustrated. The elements corresponding to those in FIGS. 1A~1K will be designated by identical numeral references.

In this embodiment, the exposed dummy gate electrode layer 105 (see FIG. 1E) posterior to the chemical mechanical polishing (CMP) process is subject to a pre-etching process 301 to remove a portion of the dummy gate electrode layer 105, and then an ammonium hydroxide treatment process 311 is performed to remove the remaining dummy gate electrode layer 105.

In an embodiment, the pre-etching process 301 is a single dry etching process. For example, the dry etching process is carried out by using carbon tetrafluoride (CF$_4$)/nitrogen gas (N$_2$) or chlorine (Cl$_2$) as a reactive gas. In another embodiment, the pre-etching process 301 is a single wet etching process. For example, the wet etching process is carried out by using an ammonium hydroxide solution, a phosphoric acid solution, a tetramethylammonium hydroxide (TMAH) solution or a combination thereof as an etchant. In some embodiments, the pre-etching process 301 may comprise a plurality of dry etching processes or a plurality of wet etching processes. In this embodiment the pre-etching process 301 is a wet etching process carried out by using the tetramethylammonium hydroxide solution as an etchant, and at least one-third of the dummy gate electrode layer 105 is removed by the pre-etching process 301 (see FIG. 3A).

In an embodiment, as shown in FIG. 3C, the ammonium hydroxide treatment process 311 is performed to remove the remaining dummy gate electrode layer 105 by contacting the dummy gate structures 10 and 12 with an ammonium hydroxide solution at an operating temperature of 60° C., wherein the ammonium hydroxide solution is a mixture of ammonium hydroxide and water in a ratio of 1:120.

Moreover, after the pre-etching process 301 and before the ammonium hydroxide treatment process 311, a pull-back process may be performed on the spacer 106 to widen the openings 110*a* and 110*b* (see FIG. 3B). The pull-back process is advantageous for performing the subsequent process of filling a metal material. Afterwards, the subsequent steps as shown in FIGS. 1H-1K are performed, and thus the CMOS device 100 is produced.

From the above description, the present invention provides an improved method for fabricating a semiconductor device. In the later stage of removing the dummy gate electrode layer, an ammonium hydroxide treatment process is performed to minimize the residual dummy gate electrode layer, so that the working function layer between the gate oxide layer and the metal gate electrode formed in the subsequent process has a satisfactory working function value to meet the electrical requirements of the metal gate electrode. In such way, the working performance of the transistor is enhanced and the production yield of the transistor is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor device, the method comprising steps of:
    providing a dummy gate structure having a dummy gate electrode layer;
    removing the dummy gate electrode layer to form an opening in the dummy gate structure, thereby exposing an underlying layer beneath the dummy gate electrode layer;
    performing an ammonium hydroxide treatment process to treat the dummy gate structure; and
    filling a metal material into the opening, wherein the ammonium hydroxide treatment process is performed in an ammonium hydroxide solution at an operating temperature of 60° C., wherein the ammonium hydroxide solution is a mixture of ammonium hydroxide and water in a ratio of 1:120, wherein
    at least one-third of the dummy gate electrode layer is removed by a pre-etching process, and at least one half of the dummy gate electrode layer is removed by the ammonium hydroxide treatment process.

2. The method according to claim 1, wherein the dummy gate structure comprises:
    a gate oxide layer formed on a substrate;
    a barrier layer formed on the gate oxide layer;
    the dummy gate electrode layer formed on the barrier layer; and
    a spacer formed over the substrate to surround the gate oxide layer, the barrier layer and the dummy gate electrode layer.

3. The method according to claim 2, wherein the step of removing the dummy gate electrode layer further comprises a step of pulling back the spacer.

4. The method according to claim 2, wherein the gate oxide layer is made of a high dielectric constant material, wherein after the gate oxide layer is formed, an ion-implanting process is performed to form source/drain regions in the substrate and adjacent to the dummy gate structure.

5. The method according to claim 1, further comprising steps of:
    performing an ion-implanting process to form source/drain regions in the substrate and adjacent to the dummy gate structure before the step of removing the dummy gate electrode layer is performed; and
    forming a high-k dielectric layer within the opening after the ammonium hydroxide treatment process is performed.

6. The method according to claim 1, wherein the step of removing the dummy gate electrode layer and the ammonium hydroxide treatment process are performed in the same process vessel.

7. A method for fabricating a semiconductor device, the method comprising steps of:
    providing a dummy gate structure having a dummy gate electrode layer;
    performing a pre-etching process to remove a portion of the dummy gate electrode layer;
    performing an ammonium hydroxide treatment process to remove the remaining dummy gate electrode layer, thereby forming an opening in the dummy gate structure and exposing an underlying layer beneath the dummy gate electrode layer; and
    filling a metal material into the opening, wherein the ammonium hydroxide treatment process is performed in an ammonium hydroxide solution at an operating temperature of 60° C., wherein the ammonium hydroxide solution is a mixture of ammonium hydroxide and water in a ratio of 1:120 wherein
    at least one-third of the dummy gate electrode layer is removed by the pre-etching process, and at least one half of the dummy gate electrode layer is removed by the ammonium hydroxide treatment process.

8. The method according to claim 7, wherein the pre-etching process is a wet etching process carried out in a tetramethylammonium hydroxide (TMAH) solution.

9. The method according to claim 7, wherein the dummy gate structure comprises:
    a gate oxide layer formed on a substrate;
    a barrier layer formed on the gate oxide layer;
    the dummy gate electrode layer formed on the barrier layer; and
    a spacer formed over the substrate to surround the gate oxide layer, the barrier layer and the dummy gate electrode layer.

10. The method according to claim 9, further comprising a step of pulling back the spacer after the pre-etching process and before the ammonium hydroxide treatment process.

11. The method according to claim 9, wherein the gate oxide layer is made of a high dielectric constant material, wherein after the gate oxide layer is formed, an ion-implanting process is performed to form source/drain regions in the substrate and adjacent to the dummy gate structure.

12. The method according to claim 7, further comprising steps of:
performing an ion-implanting process to form source/drain regions in the substrate and adjacent to the dummy gate structure before the step of removing the dummy gate electrode layer is performed; and
forming a high-k dielectric layer within the opening after the ammonium hydroxidetreatment process is performed.

13. The method according to claim 7, wherein the step of removing the portion of the dummy gate electrode layer and the ammonium hydroxide treatment process are performed in the same process vessel.

* * * * *